United States Patent
Huang

(10) Patent No.: US 10,942,541 B1
(45) Date of Patent: Mar. 9, 2021

(54) CONNECTION INTERFACE CIRCUIT, MEMORY STORAGE DEVICE AND SIGNAL GENERATION METHOD

(71) Applicant: PHISON ELECTRONICS CORP., Miaoli (TW)

(72) Inventor: Ming-Chien Huang, Hsinchu (TW)

(73) Assignee: PHISON ELECTRONICS CORP., Miaoli (TW)

( * ) Notice: Subject to any disclaimer, the term of this patent is extended or adjusted under 35 U.S.C. 154(b) by 0 days.

(21) Appl. No.: 16/656,524

(22) Filed: Oct. 17, 2019

(30) Foreign Application Priority Data

Aug. 21, 2019 (TW) .................................. 108129899

(51) Int. Cl.
| | | |
|---|---|---|
| *G06F 1/06* | (2006.01) | |
| *H04L 7/033* | (2006.01) | |
| *G11C 8/18* | (2006.01) | |
| *G11C 11/4076* | (2006.01) | |
| *G06F 1/08* | (2006.01) | |
| *H03K 5/135* | (2006.01) | |
| *H03L 7/085* | (2006.01) | |
| *G11C 29/02* | (2006.01) | |
| *G11C 7/22* | (2006.01) | |
| *H03L 7/00* | (2006.01) | |
| *G06F 13/16* | (2006.01) | |

(52) U.S. Cl.
CPC ................ *G06F 1/08* (2013.01); *H03K 5/135* (2013.01); *H03L 7/085* (2013.01); *G06F 1/06* (2013.01); *G06F 13/16* (2013.01); *G11C 7/22* (2013.01); *G11C 7/222* (2013.01); *G11C 8/18* (2013.01); *G11C 11/4076* (2013.01); *G11C 29/023* (2013.01); *H03L 7/00* (2013.01); *H04L 7/033* (2013.01); *H04L 7/0331* (2013.01)

(58) Field of Classification Search
CPC ............ G06F 1/08; H03K 5/135; H03L 7/085
USPC ...................................................... 365/233.1
See application file for complete search history.

(56) References Cited

U.S. PATENT DOCUMENTS

| | | | |
|---|---|---|---|
| 6,442,697 B1 * | 8/2002 | Jain ........................ | G06F 1/3203 713/300 |
| 2016/0246325 A1 * | 8/2016 | Chalasani ................. | G06F 1/12 |
| 2019/0007055 A1 * | 1/2019 | Nelson .................. | H03L 7/0814 |

* cited by examiner

*Primary Examiner* — Ly D Pham
(74) *Attorney, Agent, or Firm* — JCIPRNET

(57) ABSTRACT

A connection interface circuit, a memory storage device and a signal generation method are disclosed. The connection interface circuit is configured to connect a memory controller to a volatile memory module. The connection interface circuit includes a phase locking circuit, a wire module and a signal interface. The signal interface is coupled between the wire module and the memory controller. The phase locking circuit is configured to receive a first clock signal from the memory controller. The phase locking circuit is further configured to generate a second clock signal according to the first clock signal and a delay feature of the wire module. The wire module is configured to provide a third clock signal to the signal interface according to the second clock signal.

24 Claims, 6 Drawing Sheets

CONNECTION INTERFACE CIRCUIT, MEMORY STORAGE DEVICE AND SIGNAL GENERATION METHOD

CROSS-REFERENCE TO RELATED APPLICATION

This application claims the priority benefit of Taiwan application serial no. 108129899, filed on Aug. 21, 2019. The entirety of the above-mentioned patent application is hereby incorporated by reference herein and made a part of this specification.

BACKGROUND

Technical Field

The disclosure relates to a signal processing technology, and in particular, relates to a connection interface circuit, a memory storage device and a signal generation method.

Description of Related Art

In general, a memory controller can access a volatile memory module through a connection interface circuit. However, in order to align a clock signal provided to the volatile memory module by the connection interface circuit with a clock signal of the memory controller itself, normally, a delay caused by transmitting the clock signal in the connection interface circuit can be measured first, and then an delay amount of an output signal can be iteratively adjusted by the memory controller according to the delay. However, in practice, due to factors like temperature changes and/or process errors, the memory controller often needs to spend more time than expected to adjust the clock signal, thereby reducing an operational efficiency of the memory storage device.

Nothing herein should be construed as an admission of knowledge in the prior art of any portion of the present disclosure. Furthermore, citation or identification of any document in this application is not an admission that such document is available as prior art to the present disclosure, or that any reference forms a part of the common general knowledge in the art.

SUMMARY

The disclosure provides a connection interface circuit, a memory storage device and a signal generation method, which can effectively improve the operational efficiency of the memory storage device.

An exemplary embodiment of the disclosure provides a connection interface circuit, which is configured to couple a memory controller to a volatile memory module. The connection interface circuit includes a phase locking circuit, a wire module and a signal interface. The phase locking circuit is coupled to the memory controller. The wire module is coupled to the phase locking circuit. The signal interface is coupled between the wire module and the memory controller. The phase locking circuit is configured to receive a first clock signal from the memory controller. The phase locking circuit is further configured to generate a second clock signal according to the first clock signal and a delay feature of the wire module. The wire module is configured to provide a third clock signal to the signal interface according to the second clock signal.

An exemplary embodiment of the disclosure further provides a memory storage device, which includes a volatile memory module, a memory controller and a connection interface circuit. The memory interface circuit is coupled to the volatile memory module and the memory controller. The connection interface circuit is configured to receive a first clock signal from the memory controller. The connection interface circuit is further configured to generate a second clock signal according to the first clock signal and a delay feature of a wire module in the connection interface circuit. The connection interface circuit is further configured to provide a third clock signal to a signal interface between the connection interface circuit and the memory controller according to the second clock signal.

An exemplary embodiment of the disclosure further provides a signal generation method for a connection interface circuit. The connection interface circuit is configured to couple a memory controller to a volatile memory module. The signal generation method includes: receiving a first clock signal from the memory controller; generating a second clock signal according to the first clock signal and a delay feature of a wire module in the connection interface circuit; and providing a third clock signal to a signal interface between the connection interface circuit and the memory controller by the wire module according to the second clock signal.

Based on the above, after the connection interface circuit receives the first clock signal from the memory controller, the connection interface circuit can generate the second clock signal according to the first clock signal and the delay feature of the wire module in the connection interface circuit. Then, the third clock signal is provided to the signal interface between the connection interface circuit and the memory controller by the wire module according to the second clock signal. As a result, the efficiency of signal alignment between the connection interface circuit and the memory controller can be effectively improved.

It should be understood, however, that this Summary may not contain all of the aspects and embodiments of the present disclosure, is not meant to be limiting or restrictive in any manner, and that the disclosure as disclosed herein is and will be understood by those of ordinary skill in the art to encompass obvious improvements and modifications thereto.

To make the aforementioned more comprehensible, several embodiments accompanied with drawings are described in detail as follows.

DESCRIPTION OF THE EMBODIMENTS

Figure 1:
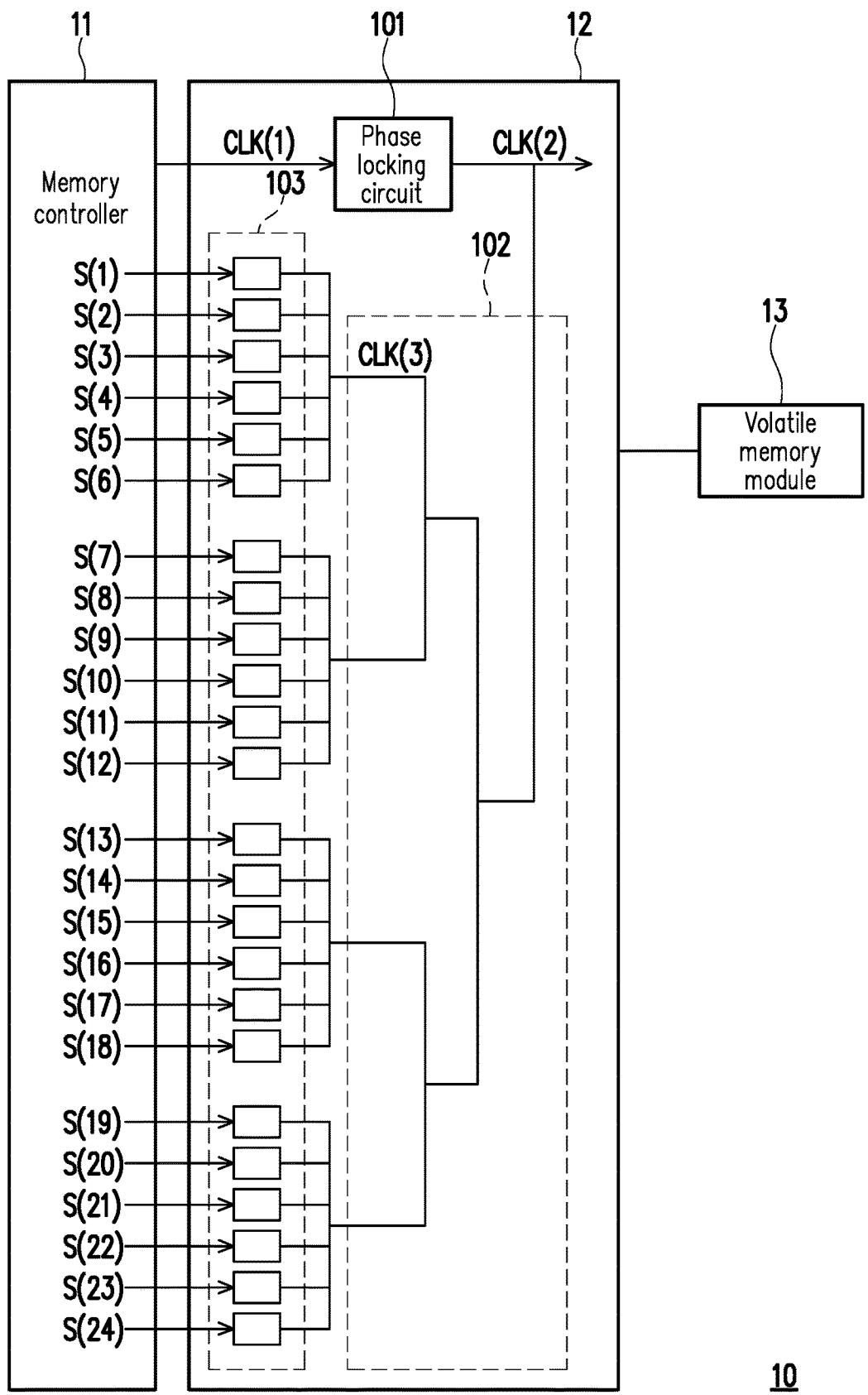
FIG. 1 is a schematic diagram illustrating a memory storage device according to an exemplary embodiment of the disclosure.

Reference will now be made in detail to the present preferred embodiments of the disclosure, examples of which are illustrated in the accompanying drawings. Wherever possible, the same reference numbers are used in the drawings and the description to refer to the same or like parts.

Embodiments of the present disclosure may comprise any one or more of the novel features described herein, including in the Detailed Description, and/or shown in the drawings. As used herein, "at least one", "one or more", and "and/or" are open-ended expressions that are both conjunctive and disjunctive in operation. For example, each of the expressions "at least one of A, B and C", "at least one of A, B, or C", "one or more of A, B, and C", "one or more of A, B, or C" and "A, B, and/or C" means A alone, B alone, C alone, A and B together, A and C together, B and C together, or A, B and C together.

It is to be noted that the term "a" or "an" entity refers to one or more of that entity. As such, the terms "a" (or "an"), "one or more" and "at least one" can be used interchangeably herein.

The provided exemplary embodiments can be suitably combined. The term "coupling/coupled" used in this specification (including claims) may refer to any direct or indirect connection means. For example, "a first device is coupled to a second device" should be interpreted as "the first device is directly connected to the second device" or "the first device is indirectly connected to the second device through other devices or connection means." In addition, the term "signal" can mean a current, a voltage, a charge, a temperature, data or any one or multiple signals.

FIG. 1 is a schematic diagram illustrating a memory storage device according to an exemplary embodiment of the disclosure. Referring to FIG. 1, a memory storage device 10 includes a memory controller 11, a connection interface circuit 12 and a volatile memory module 13. The memory controller 11, the connection interface circuit 12 and the volatile memory module 13 may be installed on one or more circuit boards in the memory storage device 10. The memory controller 11 supports separate and/or parallel data access operations for the volatile memory module 13.

The memory controller 11 can serve as a communication bridge between a central processing unit (not shown) and the volatile memory module 13 and can be dedicated to control the volatile memory module 13. In an exemplary embodiment, the memory controller 11 is also known as a dynamic random access memory controller (DRAM controller).

The volatile memory module 13 can be used to temporarily store data. For example, the volatile memory module 13 may include various types of volatile memory modules including a DDR SDRAM (first generation Double Data Rate Synchronous Dynamic Random Access Memory), a DDR 2 SDRAM (second generation Double Data Rate Synchronous Dynamic Random Access Memory), a DDR 3 SDRAM (third generation Double Data Rate Synchronous Dynamic Random Access Memory), a DDR 4 SDRAM (fourth generation Double Data Rate Synchronous Dynamic Random Access Memory). Also, the number of the volatile memory module 13 may be one or more.

The connection interface circuit 12 is configured to connect the memory controller 11 to the volatile memory module 13. When data is to be read from the volatile memory module 13 or data is to be stored into the volatile memory module 13, the memory controller 11 can send a control command to the volatile memory module 13 through the connection interface circuit 12. When the control command is received by the volatile memory module 13, the volatile memory module 13 can store write-data corresponding to the control command or return read-data corresponding to the control command to the memory controller 11 through the connection interface circuit 12. In an exemplary embodiment, the connection interface circuit 12 is also known as a memory interface circuit.

In an exemplary embodiment, the connection interface circuit 12 includes a phase locking circuit 101, a wire module 102 and a signal interface 103. The phase locking circuit 101 is coupled to the memory controller 11. The wire module 102 is coupled between the phase locking circuit 101 and the signal interface 103. The signal interface 103 is coupled between the connection interface circuit 12 and the memory controller 11.

In an exemplary embodiment, the phase locking circuit 101 is also known as a phase-locked loop (PLL) circuit. The phase locking circuit 101 can receive a clock signal (a.k.a. a first clock signal) CLK(1) from the memory controller 11. The phase locking circuit 101 can generate a clock signal (a.k.a. a second clock signal) CLK(2) according to the clock signal CLK(1) and a delay feature of the wire module 102. The wire module 102 can provide a clock signal (a.k.a. a third clock signal) CLK(3) to the signal interface 103 according to the clock signal CLK(2).

In general, a delay of the clock signal CLK(2) will occur in the process of being transmitted by the wire module 102, causing a phase difference between the clock signals CLK(3) and CLK(2) to shift. Therefore, conventionally, after the memory controller 11 provides the clock signal CLK(1) to the phase locking circuit 101, the memory controller 11 needs to adjust a phase of the clock signal CLK(3) provided by the wire module 102 so that the phase of the clock signal CLK(3) and a phase of CLK(1) are aligned with each other. Thereafter, signals S(1) to S(24) outputted by the memory controller 11 can be correctly cooperated with the clock signal CLK(3) in the signal interface 103 to, for example, sample the signals S(1) to S(24) at a correct phase. Here, the signals S(1) to S(24) may include a data signal and/or a command signal.

Traditionally, the memory controller 11 mainly adjusts the phase of the clock signal CLK(3) with a preset delay amount to initially attempt to bring the phase of the clock signal CLK(3) closer to the phase of CLK(1). In addition, the memory controller 11 can further correct the phase of the clock signal CLK(3) in an iterative manner. However, under the influence of temperature changes and/or process variations, such adjustment may take more time than expected, resulting in a decrease in the performance of the memory storage device 10.

In an exemplary embodiment, the phase locking circuit 101 can simulate the delay feature of the wire module 102 and generate the clock signal CLK(2) according to such delay feature. For example, the phase locking circuit 101 can attempt to lock a phase difference between the clock signals CLK(1) and CLK(2) at a target phase difference according to the delay feature of the wire module 102. The target phase difference can be affected by the delay feature of the wire module 102. Then, in the process of transmitting the clock signal CLK(2) to the signal interface 103, the wire module 102 can delay the clock signal CLK(2) according to its own delay feature to generate the clock signal CLK(3). In particular, an delay amount of the clock signal CLK(2) in the wire module 102 corresponds to the target phase difference described above. In this way, at output terminals of the wire module 102, the phase of the clock signal CLK(3) and the phase of the clock signal CLK(1) can be substantially aligned with each other. It should be noted that, the so-called "substantially aligned" may refer to "completely aligned" or "partially aligned with fractional error allowed".

Figure 2:
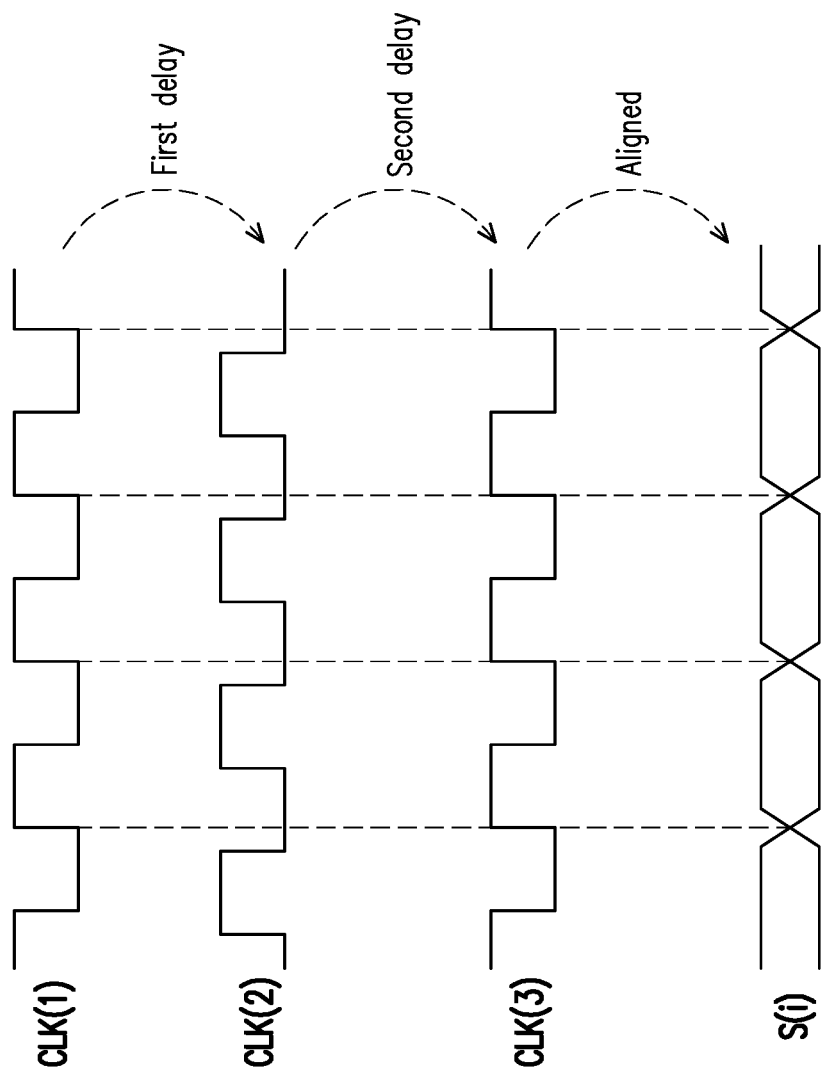
FIG. 2 is a timing diagram of a plurality of signals according to an exemplary embodiment of the disclosure.

FIG. 2 is a timing diagram of a plurality of signals according to an exemplary embodiment of the disclosure. Referring to FIG. 1 and FIG. 2, the phase locking circuit 101 can delay the clock signal CLK(1) according to the delay feature of the wire module 102 to generate the clock signal CLK(2) (i.e., a first delay) so that the target phase difference (e.g., n degrees) is generated between the clock signals CLK(1) and CLK(2). Then, in the process of transmitting the clock signal CLK(2) to the signal interface 103, the wire module 102 can delay the clock signal CLK(2) according to its own delay feature to generate the clock signal CLK(3) (i.e., a second delay). The phase of the clock signal CLK(3) output by the wire module 102 and the phase of the clock signal CLK(1) can be substantially aligned with each other. In addition, the clock signal CLK(3) output by the wire module 102 can also be automatically aligned with a signal S(i) to facilitate a subsequent analysis of the signal S(i). The signal S(i) may be any one of the signals S(1) to S(24) in FIG. 1.

In other words, after the first delay, the target phase difference can be generated between the clock signals CLK (1) and CLK(2). However, after the second delay, the target phase difference can be recovered or removed so that the phase of the clock signal CLK(3) and the phase of the clock signal CLK(1) can be substantially aligned with each other. In an exemplary embodiment, under the influence of temperature changes and/or process variations, in response to changes in the delay feature of the wire module 102, the phase locking circuit 101 can dynamically adjust the target phase difference. According to the dynamically adjusted target phase difference, the phase of the clock signal CLK(3) can continuously be substantially aligned with the phase of the clock signal CLK(1).

Figure 3:
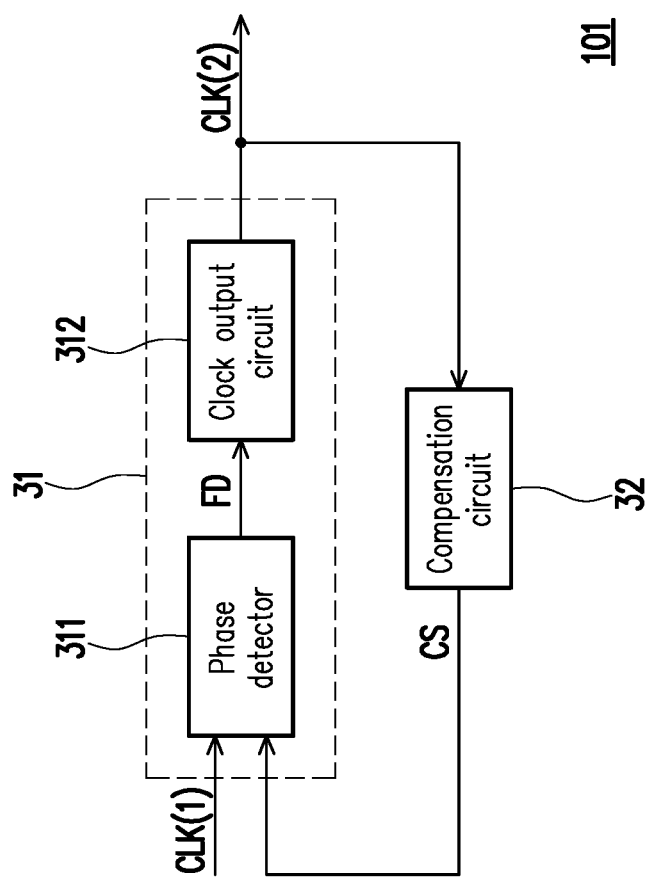
FIG. 3 is a schematic diagram illustrating a phase locking circuit according to an exemplary embodiment of the disclosure.

FIG. 3 is a schematic diagram illustrating a phase locking circuit according to an exemplary embodiment of the disclosure. Referring to FIG. 3, the phase locking circuit 101 includes a modulation circuit 31 and a compensation circuit 32. The modulation circuit 31 is coupled to the memory controller 101 and the wire module 102 of FIG. 1. The compensation circuit 32 is coupled to the modulation circuit 31. The modulation circuit 31 can receive the clock signal CLK(1) and a compensation signal CS. The modulation circuit 31 can generate the clock signal CLK(2) according to the clock signal CLK(1) and the compensation signal CS. For example, the modulation circuit 31 can be used to continuously adjust (e.g., delay) the phase of the clock signal CLK(2) to reduce a phase difference between the clock signal CLK(1) and the compensation signal CS. After reaching a steady state (e.g., a phase of the compensation signal CS catches up with the phase of the pulse signal CLK(1)), the modulation circuit 31 can lock the phase difference between the clock signals CLK(1) and CLK(2) at the target phase difference.

In an exemplary embodiment, the modulation circuit 31 includes a phase detector 311 and a clock output circuit 312. The phase detector 311 can receive the clock signal CLK(1) and the compensation signal CS. The phase detector 311 can detect the phase difference between the clock signal CLK(1) and the compensation signal CS and generate a phase difference signal FD. For example, the phase difference signal FD can reflect the phase difference between the clock signal CLK(1) and the compensation signal CS. The clock output circuit 312 can receive the phase difference signal FD and generate the clock signal CLK(2) according to the phase difference signal FD. For example, the clock output circuit 312 may include a charge pump, a voltage controlled oscillator and/or a voltage divider. The clock output circuit 312 can continuously adjust the phase of the clock signal CLK(2) according to the phase difference signal FD.

The compensation circuit 32 can generate the compensation signal CS according to the clock signal CLK(2). For example, the compensation circuit 32 can simulate the delay feature of the wire module 102 and delay the clock signal CLK(2) according to such delay feature to generate the compensation signal CS.

Figure 4:
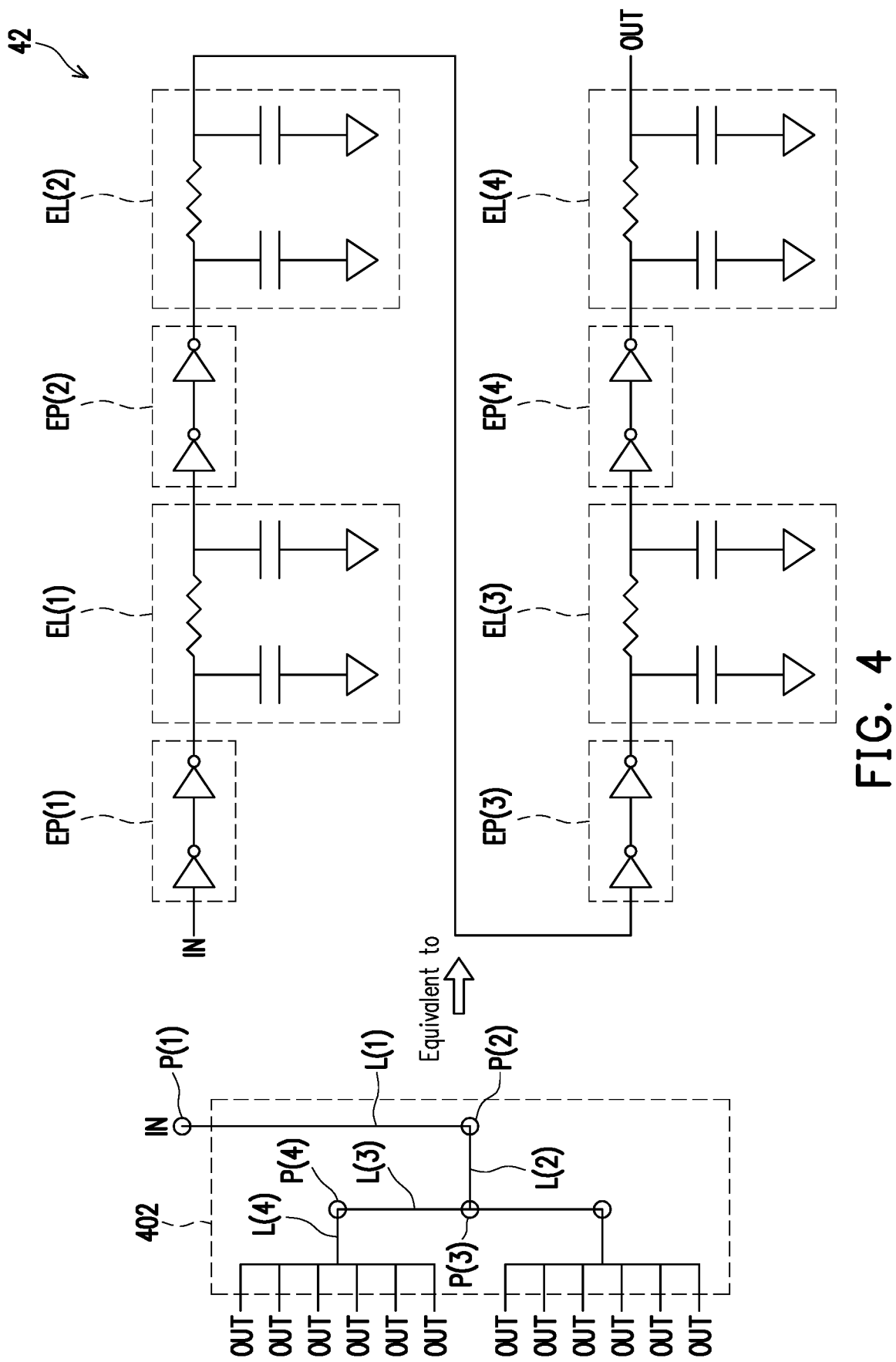
FIG. 4 is an equivalent schematic diagram illustrating a compensation circuit according to an exemplary embodiment of the disclosure.

FIG. 4 is an equivalent schematic diagram illustrating a compensation circuit according to an exemplary embodiment of the disclosure. Referring to FIG. 4, taking a wire module 402 as an example, the wire module 402 includes connection lines L(1) to L(4) and wiring turning points P(1) to P(4). The wire module 402 can delay a signal at an input terminal IN according to its own delay feature and output the delayed signal at output terminals OUT.

A compensation circuit 42 is an equivalent circuit of the wire module 402. The compensation circuit 42 can simulate the delay feature of the wire module 402. For example, the compensation circuit 42 includes circuit modules (a.k.a. first circuit modules) EL(1) to EL(4) and circuit modules (a.k.a. second circuit modules) EP(1) to EP(4). The circuit modules EL(1) to EL(4) can be used to simulate delay features of the connection lines L(1) to L(4) in the wire module 402, respectively. The circuit modules EP(1) to EP(4) can be used to simulate delay features of the wiring turning points P(1) to P(4) in the wire module 402, respectively.

In an exemplary embodiment, each of the circuit modules EL(1) to EL(4) includes at least one RC circuit. As shown by FIG. 4, one RC circuit can include at least one resistance component and at least one capacitance component. In an exemplary embodiment, each of the circuit modules EP(1) to EP(4) includes at least one buffer component. As shown by FIG. 4, one buffer component may be a non-reversing or reversing delay component (e.g., a reversing amplifier). An delay amount generated by a signal passing through the wire module 402 can be equal to an delay amount generated by the signal passing through the compensation circuit 42. A similar circuit design can be applied to design the compensation circuit 32 of FIG. 3 to simulate the delay feature of the wire module 102 of FIG. 1.

In an exemplary embodiment of FIG. 1 and/or FIG. 3, the phase locking circuit 101 and/or the clock output circuit 312 can generate the clock signal CLK(2) with 1× frequency. That is to say, the frequency of the clock signal CLK(2) is identical to the frequency of the clock signal CLK(1). Nonetheless, in an exemplary embodiment of FIG. 1 and/or FIG. 3, the phase locking circuit 101 and/or the clock output circuit 312 can also generate a 2× clock signal, a 4× clock signal or a clock signal with frequency of other multiples. For example, the frequency of the 2× clock signal is 2 times the frequency of the clock signal CLK(2), the frequency of the 4× clock signal is 4 times the frequency of the clock signal CLK(2), and so on and so forth.

It should be noted that the schematic diagrams of the circuit structures presented in FIG. 1, FIG. 3 and FIG. 4 are merely examples and are not intended to limit the disclosure. In other exemplary embodiments not mentioned, more electronic components may be included in the circuit structures presented in FIG. 1, FIG. 3, and FIG. 4 to provide additional functionality. Alternatively, some of the electronic components in the circuit structure presented in FIG. 1, FIG. 3, and FIG. 4 may be replaced by electronic components having the same or similar functions, and the disclosure is not limited thereto.

Figure 5:
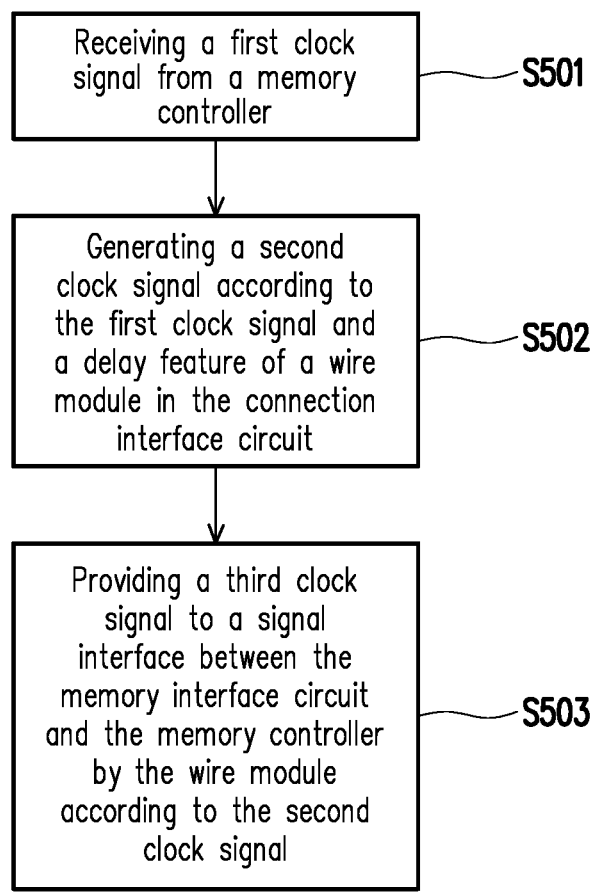
FIG. 5 is a flowchart illustrating a signal generation method according to an exemplary embodiment of the disclosure.

FIG. 5 is a flowchart illustrating a signal generation method according to an exemplary embodiment of the disclosure. Referring to FIG. 5, in step S501, a first clock signal is received from a memory controller. In step S502, a second clock signal is generated according to the first clock signal and a delay feature of a wire module in the connection interface circuit. In step S503, a third clock signal is provided to a signal interface between the connection interface circuit and the memory controller by the wire module according to the second clock signal.

Nevertheless, steps depicted in FIG. 5 are described in detail as above so that related description thereof is omitted hereinafter. It should be noted that, the steps depicted in FIG. 5 may be implemented as a plurality of program codes or circuits, which are not particularly limited in the disclosure. Moreover, the method disclosed in FIG. 5 may be implemented by reference with above exemplary embodiments, or may be implemented separately, which are not particularly limited in the disclosure.

Figure 6:
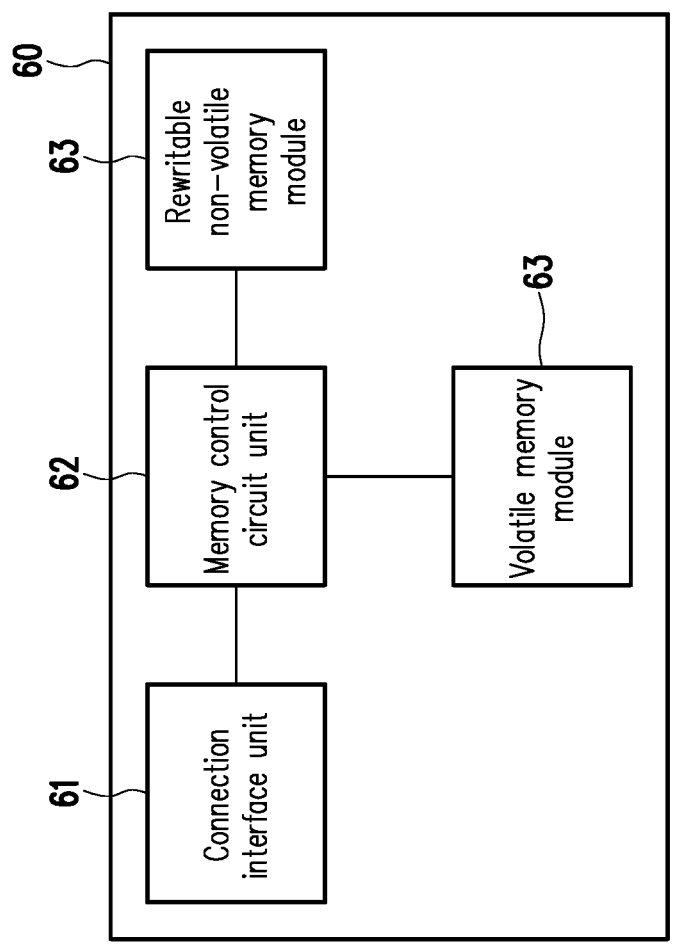
FIG. 6 is a schematic diagram illustrating a memory storage device according to an exemplary embodiment of the disclosure.

FIG. 6 is a schematic diagram illustrating a memory storage device according to an exemplary embodiment of the disclosure. Referring to FIG. 6, a memory storage device 60 is a memory storage device including both a rewritable non-volatile memory module 63 and a volatile memory module 64, such as a SSD (Solid State Drive). The memory storage device 60 can be used together with a host system so the host system can write data into the memory storage device 60 or read data from the memory storage device 60. For example, the mentioned host system may be any system capable of substantially cooperating with the memory storage device 60 for storing data, such as a desktop computer, a notebook computer, a digital camera, a video camera, a communication device, an audio player, a video player or a tablet computer.

The memory storage device 60 includes a connection interface unit 61, a memory control circuit unit 62, the rewritable non-volatile memory module 63 and the volatile memory module 64. The connection interface unit 61 is configured to connect the memory storage device 60 to the host system. In an exemplary embodiment, the connection interface unit 61 is compatible with a SATA (Serial Advanced Technology Attachment) standard. Nevertheless, it should be understood that the disclosure is not limited in this regard. The connection interface unit 61 may also be compatible with a PATA (Parallel Advanced Technology Attachment) standard, a PCI Express (Peripheral Component Interconnect Express) interface standard, a USB (Universal Serial Bus) standard or other suitable standards. The connection interface unit 61 may be packaged together with the memory control circuit unit 62 into one chip, or the connection interface unit 61 may also be distributed outside of a chip containing the memory control circuit unit 62.

The memory control circuit unit 62 is configured to perform operations of writing, reading or erasing data in the rewritable non-volatile memory module 63 according to the control commands. For example, the memory control circuit unit 62 may include the memory controller 11 and the connection interface circuit 12 in FIG. 1 to control the volatile memory module 64.

The rewritable non-volatile memory module 63 is coupled to the memory control circuit unit 62 and configured to store data written from the host system. The rewritable non-volatile memory module 63 may be a SLC (Single Level Cell) NAND flash memory module (i.e., a flash memory module capable of storing one bit in one memory cell), an MLC (Multi Level Cell) NAND flash memory module (i.e., a flash memory module capable of storing two bits in one memory cell), a TLC (Triple Level Cell) NAND flash memory module (i.e., a flash memory module capable of storing three bits in one memory cell), a QLC (Qual Level Cell) NAND-type flash memory module (i.e., a flash memory module capable of storing four bits in one memory cell), other flash memory modules or other memory modules having the same features.

In summary, after the first delay of the phase locking circuit, the target phase difference can be generated between the first clock signal and the second clock signal. Then, after the second delay of the wire module, the target phase difference can be recovered or removed so that the phase of the third clock signal and the phase of the first clock signal can be substantially aligned with each other. Accordingly, under the influence of temperature changes and/or process variations, the phase of the third clock signal can continuously be substantially aligned with the phase of the first clock signal. As a result, the efficiency of signal alignment between the connection interface circuit and the memory controller can be effectively improved.

The previously described exemplary embodiments of the present disclosure have the advantages aforementioned, wherein the advantages aforementioned not required in all versions of the disclosure.

It will be apparent to those skilled in the art that various modifications and variations can be made to the structure of the present disclosure without departing from the scope or spirit of the disclosure. In view of the foregoing, it is intended that the present disclosure cover modifications and variations of this disclosure provided they fall within the scope of the following claims and their equivalents.

What is claimed is:

1. A connection interface circuit for coupling a memory controller to a volatile memory module, the connection interface circuit comprising:
   a phase locking circuit, coupled to the memory controller;
   a wire module, coupled to the phase locking circuit; and
   a signal interface, coupled between the wire module and the memory controller,
   wherein the phase locking circuit is configured to receive a first clock signal from the memory controller,
   the phase locking circuit is further configured to generate a second clock signal according to the first clock signal and a delay feature of the wire module, and
   the wire module is configured to provide a third clock signal to the signal interface according to the second clock signal.

2. The connection interface circuit according to claim 1, wherein the phase locking circuit is further configured to lock a phase difference between the first clock signal and the second clock signal at a target phase difference, and the target phase difference is affected by the delay feature of the wire module.

3. The connection interface circuit according to claim 2, wherein the wire module is further configured to delay the second clock signal to generate the third clock signal, and a delay amount of the second clock signal corresponds to the target phase difference.

4. The connection interface circuit according to claim 1, wherein the phase locking circuit comprises:
   a modulation circuit, coupled to the memory controller and the wire module; and
   a compensation circuit, coupled to the modulation circuit, wherein the modulation circuit is configured to generate the second clock signal according to the first clock signal and a compensation signal, and
   the compensation circuit is configured to generate the compensation signal according to the second clock signal.

5. The connection interface circuit according to claim 4, wherein the compensation circuit comprises:
   at least one first circuit module, configured to simulate a delay feature of at least one connection line in the wire module; and at least one second circuit module, coupled to the at least one first circuit module and configured to simulate a delay feature of at least one wiring turning point in the wire module.

6. The connection interface circuit according to claim 5, wherein the at least one first circuit module comprises at least one RC circuit.

7. The connection interface circuit according to claim 5, wherein the at least one second circuit module comprises at least one buffer component.

8. The connection interface circuit according to claim 4, wherein the modulation circuit comprises:
   a phase detector, coupled to the memory controller and the compensation circuit; and
   a clock output circuit, coupled to the phase detector and the wire module,
   wherein the phase detector is configured to detect a phase difference between the first clock signal and the compensation signal, and
   the clock output circuit is configured to generate the second clock signal according to the phase difference.

9. A memory storage device, comprising:
   a volatile memory module;
   a memory controller; and
   a connection interface circuit, coupled to the volatile memory module and the memory controller,
   wherein the connection interface circuit is configured to receive a first clock signal from the memory controller,
   the connection interface circuit is further configured to generate a second clock signal according to the first clock signal and a delay feature of a wire module in the connection interface circuit, and
   the connection interface circuit is further configured to provide a third clock signal to a signal interface between the connection interface circuit and the memory controller according to the second clock signal.

10. The memory storage device according to claim 9, wherein the connection interface circuit is further configured to lock a phase difference between the first clock signal and the second clock signal at a target phase difference, and the target phase difference is affected by the delay feature of the wire module.

11. The memory storage device according to claim 10, wherein the connection interface circuit is further configured to delay the second clock signal by the wire module to generate the third clock signal, and a delay amount of the second clock signal corresponds to the target phase difference.

12. The memory storage device according to claim 9, wherein the connection interface circuit comprises:
   a modulation circuit, coupled to the memory controller; and
   a compensation circuit, coupled to the modulation circuit,
   wherein the modulation circuit is configured to generate the second clock signal according to the first clock signal and a compensation signal, and
   the compensation circuit is configured to generate the compensation signal according to the second clock signal.

13. The memory storage device according to claim 12, wherein the compensation circuit comprises:
   at least one first circuit module, configured to simulate a delay feature of at least one connection line in the wire module; and
   at least one second circuit module, coupled to the at least one first circuit module and configured to simulate a delay feature of at least one wiring turning point in the wire module.

14. The memory storage device according to claim 13, wherein the at least one first circuit module comprises at least one RC circuit.

15. The memory storage device according to claim 13, wherein the at least one second circuit module comprises at least one buffer component.

16. The memory storage device according to claim 12, wherein the modulation circuit comprises:
   a phase detector, coupled to the memory controller and the compensation circuit; and
   a clock output circuit, coupled to the phase detector and the wire module,
   wherein the phase detector is configured to detect a phase difference between the first clock signal and the compensation signal, and
   the clock output circuit is configured to generate the second clock signal according to the phase difference.

17. A signal generation method for a connection interface circuit, wherein the connection interface circuit is configured to connect a memory controller and a volatile memory module, and the signal generation method comprises:
   receiving a first clock signal from the memory controller;
   generating a second clock signal according to the first clock signal and a delay feature of a wire module in the connection interface circuit; and
   providing a third clock signal to a signal interface between the connect interface circuit and the memory controller by the wire module according to the second clock signal.

18. The signal generation method according to claim 17, further comprising:
   locking a phase difference between the first clock signal and the second clock signal at a target phase difference, wherein the target phase difference is affected by the delay feature of the wire module.

19. The signal generation method according to claim 18, further comprising:
   delaying the second clock signal by the wire module to generate the third clock signal, wherein a delay amount of the second clock signal corresponds to the target phase difference.

20. The signal generation method according to claim 17, wherein the step of generating the second clock signal according to the first clock signal and the delay feature of the wire module in the connection interface circuit comprises:
   generating the second clock signal according to the first clock signal and a compensation signal; and
   generating the compensation signal according to the second clock signal.

21. The signal generation method according to claim 20, further comprising:
   simulating a delay feature of at least one connection line in the wire module; and
   simulating a delay feature of at least one wiring turning point in the wire module.

22. The signal generation method according to claim 21, wherein the step of simulating the delay feature of the at least one connection line in the wire module comprises:
   simulating the delay feature of the at least one connection line in the wire module by at least one RC circuit.

23. The signal generation method according to claim 21, wherein the step of simulating the delay feature of the at least one wiring turning point in the wire module comprises:
   simulating the delay feature of the at least one wiring turning point by at least one buffer component.

24. The signal generation method according to claim 20, wherein the step of generating the second clock signal according to the first clock signal and the compensation signal comprises:

detecting a phase difference between the first clock signal and the compensation signal; and generating the second clock signal according to the phase difference.

* * * * *